United States Patent
D'Angelo (10) Patent No.: US 10,693,409 B2
(45) Date of Patent: Jun. 23, 2020

(54) HALF-BRIDGE DRIVER CIRCUIT, RELATED INTEGRATED CIRCUIT AND SYSTEM

(71) Applicant: STMicroelectronics S.r.l., Agrate Brianza (IT)

(72) Inventor: Giuseppe D'Angelo, Tufino (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/294,573

(22) Filed: Mar. 6, 2019

(65) Prior Publication Data

US 2019/0280635 A1 Sep. 12, 2019

(30) Foreign Application Priority Data

Mar. 7, 2018 (IT) .................. 102018000003339

(51) Int. Cl.
*H02P 27/08* (2006.01)
*H02M 7/5387* (2007.01)
(Continued)

(52) U.S. Cl.
CPC ........ *H02P 27/08* (2013.01); *H02M 7/53873* (2013.01); *H02P 6/085* (2013.01);
(Continued)

(58) Field of Classification Search
CPC ............ H02M 7/5387; H02M 7/53873; H03K 17/063; H03K 17/284; H03K 19/018507; H02P 27/06; H02P 27/08; H02P 6/085
See application file for complete search history.

(56) References Cited

U.S. PATENT DOCUMENTS

| 4,772,996 A | 9/1988 | Hanei et al. |
| 6,269,014 B1 * | 7/2001 | Sander .................. H02M 7/003 363/132 |

(Continued)

FOREIGN PATENT DOCUMENTS

| EP | 1826899 A1 | 8/2007 |
| EP | 2169411 A1 | 3/2010 |
| WO | 2016080950 A1 | 5/2016 |

OTHER PUBLICATIONS

Arrigo, D., "L6234 Three Phase Motor Driver", AN1088 Application Note, Apr. 2001, 14 pages.
(Continued)

*Primary Examiner* — Thai T Dinh
(74) *Attorney, Agent, or Firm* — Slater Matsil, LLP (57) ABSTRACT

A half-bridge driver circuit is configured to generate drive signals based on control signals. A processing circuit is configured to generate high side and low side control signals based on a control signal. An edge detector is configured to generate first and second signals in response to rising and falling edges in the control signal. A state machine transitions between states in response to the first and second signals, and is configured to sequentially, in response to the first signal, set the high side and low side control signals low; in response to the second signal, set the high side control signal high and the low side control signal low; in response to the first signal, set the high side and low side control signals low; and in response to the second signal, set the high side control signal low and the low side control signal high.

22 Claims, 8 Drawing Sheets

(51) Int. Cl.
  *H02P 6/08* (2016.01)
  *H03K 17/284* (2006.01)
  *H03K 19/0185* (2006.01)
  *H02M 1/00* (2006.01)

(52) U.S. Cl.
  CPC ... *H03K 17/284* (2013.01); *H03K 19/018507* (2013.01); *H02M 2001/0009* (2013.01)

(56) References Cited

U.S. PATENT DOCUMENTS

| | | | |
|---|---|---|---|
| 7,710,167 B2* | 5/2010 | Bernacchia | H02M 7/5388 |
| | | | 327/108 |
| 8,395,423 B2* | 3/2013 | Seki | H02M 3/158 |
| | | | 327/108 |
| 9,625,932 B2* | 4/2017 | Qu | G05F 3/02 |
| 10,277,217 B2* | 4/2019 | Lakirovich | H02M 7/538 |
| 2003/0006749 A1 | 1/2003 | Rollman | |
| 2012/0075000 A1 | 3/2012 | Cho et al. | |
| 2017/0063364 A1 | 3/2017 | Scorrano et al. | |
| 2018/0175850 A1 | 6/2018 | Gariboldi | |

OTHER PUBLICATIONS

STMicroelectronics, "Automotive FET driver for 3 phase BLDC motor", ST life,augmented, L9907, Jun. 2018, DS11800 Rev 2, 46 pages.

* cited by examiner

HALF-BRIDGE DRIVER CIRCUIT, RELATED INTEGRATED CIRCUIT AND SYSTEM

CROSS-REFERENCE TO RELATED APPLICATIONS

This application claims priority to Italian Patent Application No. 102018000003339, filed on Mar. 7, 2018, which application is hereby incorporated herein by reference.

TECHNICAL FIELD

The present invention relates generally to an electronic system and method, and, in particular embodiments, to half-bridge driver circuit, related integrated circuit and system.

BACKGROUND

In automotive applications, the use of Direct Current (DC) or Brushless DC (BLDC) motors for fan, pump or actuator applications is very common with the trend of replacing the traditional DC with BLDC motors. In most automotive applications, detection of fault conditions of the BLDC motor and the control electronics is mandatory. For this reason, the control electronics should be able to identify a possible fault condition and then apply counter measures, e.g., in order to protect the system. Often, the detected fault condition is reported to a system controller and may be accessible via the diagnosis interface of the automobile for further service investigations.

As disclosed, e.g., in the Italian patent application IT102016000009376, a motor is often driven by using one or more half-bridges as a function of one or more respective Pulse-Width Modulated (PWM) signals.

Figure 1:
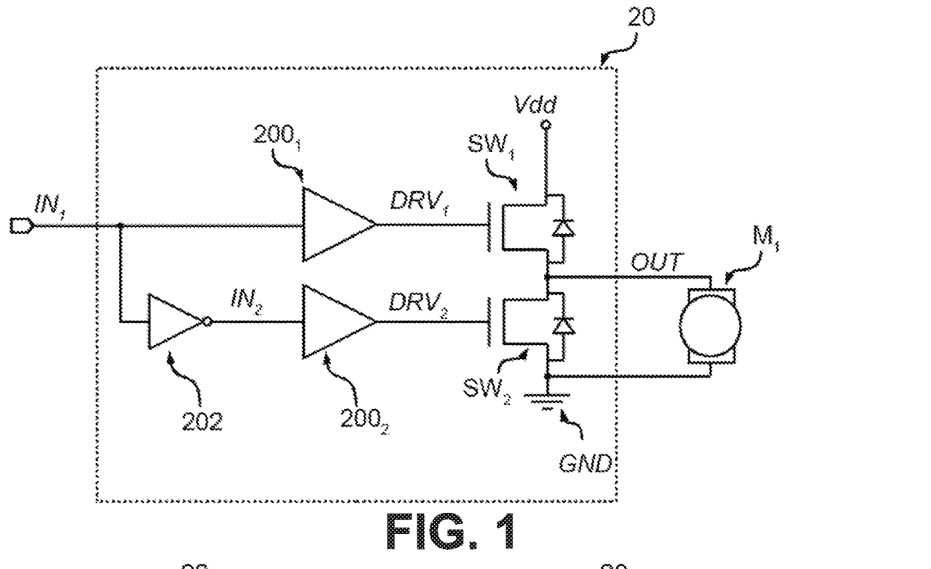
FIGS. 1, 2, 3 and 4 show solutions for driving a motor.

For example, FIG. 1 shows a typical half-bridge arrangement 20 comprising two electronic switches $SW_1$ and $SW_2$, such as n-channel power Field-Effect Transistors (FETs), such as Metal-Oxide-Semiconductor Field-Effect Transistors (MOSFETs), connected in series between supply voltage Vdd and ground GND.

Usually, the switches $SW_1$ and $SW_2$ are closed alternatively in order to connect the output OUT of the half-bridge arrangement 20, i.e., the intermediate point between the switches $SW_1$ and $SW_2$, either to the voltage Vdd or to ground GND. For this purpose, the half-bridge is driven as a function of two drive signals $DRV_1$ and $DRV_2$, which are connected (e.g., directly) to the control gates of the switches $SW_1$ and $SW_2$, respectively. Specifically, in order to correctly drive the control gates, often a high-side driver $200_1$ is used to generate the drive signal $DRV_1$ for the high-side switch $SW_1$ as a function of a first control signal $IN_1$, and a low-side driver $200_2$ is used to generate the drive signal $DRV_2$ for the low-side switch $SW_2$ as a function of a control signal $IN_2$. The control signal $IN_2$ corresponds often to an inverted version of the signal IN, (or vice versa), i.e., the signal $IN_2$ is low when the signal $IN_1$ is high and vice versa. For example, in FIG. 1, inverter 202 is used, which receives at an input the signal $IN_1$ and provides at an output the signal $IN_2$.

The output OUT of the half-bridge arrangement 20 may be used to drive a load. For example, in FIG. 1, the half-bridge arrangement 20 drives a motor $M_1$ connected between the output OUT of the half-bridge arrangement 20 and ground GND.

Figure 2:
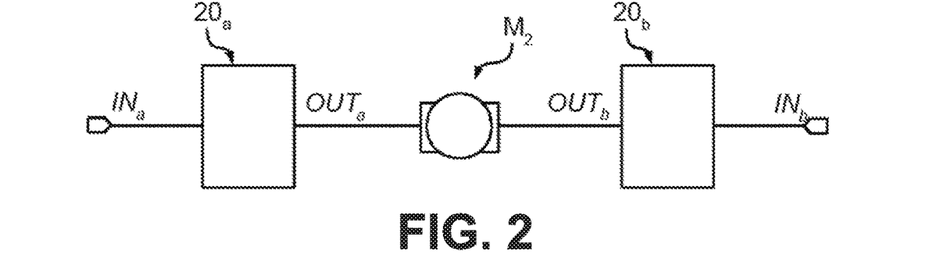

Conversely, FIG. 2 shows an example in which two half-bridge arrangements $20_a$ and $20_b$ are used to drive a linear motor $M_2$, such as a voice coil motor, connected between the output $OUT_a$ of the first bridge arrangement $20_a$ and the output $OUT_b$ of the second bridge arrangement $20_b$. As well known to those of skill in the art, in this case, also the rotation direction of the motor $M_2$ may be controlled by applying appropriate control signals $IN_a$ and $IN_b$ to the half-bridge arrangements $20_a$ and $20_b$.

Figure 3:
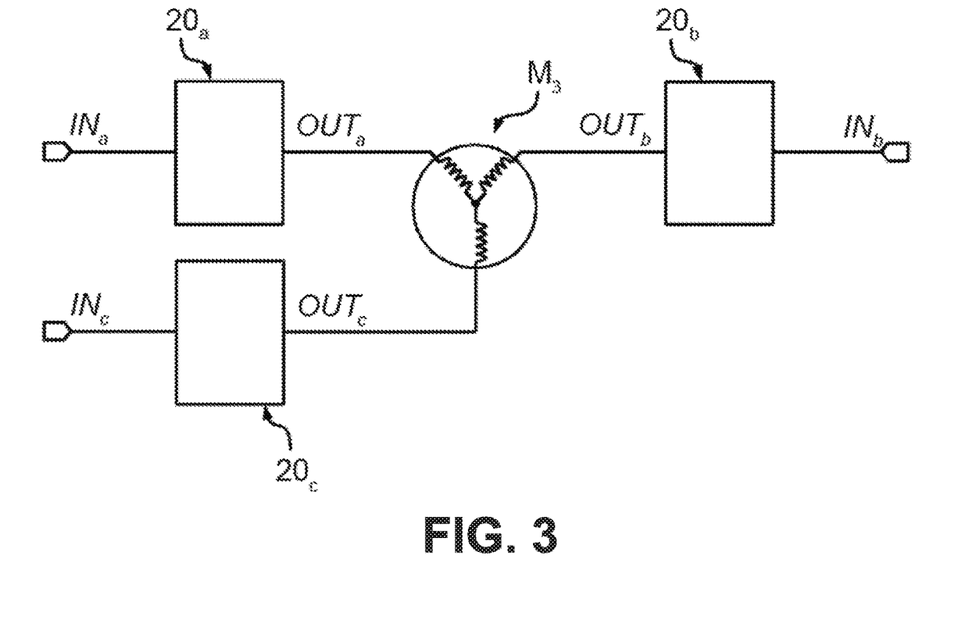

Finally, FIG. 3 shows an example in which three half-bridge arrangements $20_a$, $20_b$ and $20_c$ are used to drive a three-phase motor $M_3$, such as a spindle motor, connected between the outputs $OUT_a$, $OUT_b$ and $OUT_c$ of three half-bridge arrangements $20_a$, $20_b$ and $20_c$.

As mentioned before, the control signals may be PWM signals, i.e., signals with a fixed frequency and a variably duty cycle. For example, Italian patent application IT102015000046790 discloses a solution for generating two PWM signals which may be used, e.g., for generating the signals $IN_a$ and $IN_b$ in the solution shown in FIG. 2.

Figure 4:
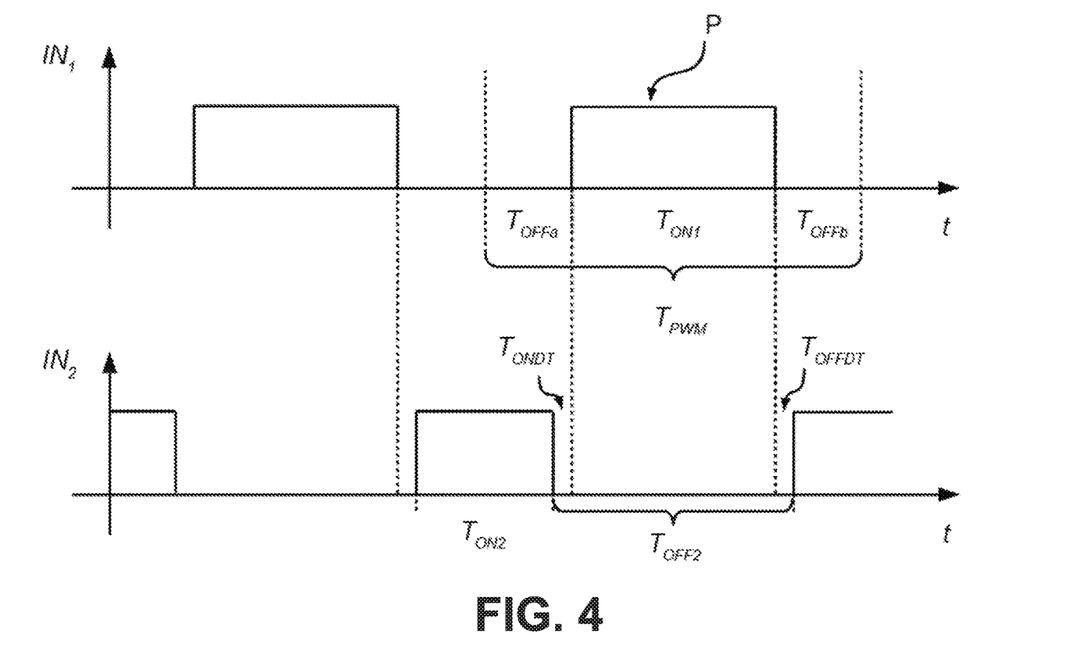

FIG. 4 shows in this respect a typical PWM signal, in particular the signal $IN_1$, corresponding to a pulsed signal comprising a single pulse P for each switching cycle with duration or period $T_{PWM}$, wherein the switch-on duration $T_{ON1}$ of the pulse P may be variable.

Generally, the pulse P is not necessarily at the beginning of each switching cycle, but each switching cycle may comprise an initial switch-off period $T_{OFFa}$ before the pulse P and a final switch-off period $T_{OFFb}$ after the pulse P, with:

$$T_{PWM1} = T_{OFFa} + T_{ON1} + T_{OFFb} \quad (1)$$

with the switch-off duration $T_{OFF1}$ being:

$$T_{OFF1} = T_{OFFa} + T_{OFFb} \quad (2)$$

wherein the duty cycle D of the signal $IN_1$ for each switching cycle is given by:

$$D = T_{ON1}/T_{PWM} \quad (3)$$

For example, in most high-end automotive applications (e.g., Electric Power Steering, Electric Turbo Charge, etc.), a Smart Power Device (SPD) is used to generate the drive signals for the high side and low side switches ($SW_1/SW_2$) in order to drive, e.g., a three-phase BLDC motor. A typical SPD device is the integrated circuit (IC) STMicroelectronics L9907, as described e.g., in "L9907-*Automotive FET driver for 3 phase BLDG motor—Datasheet—production data*", March 2017, DocID029666 Rev 1, which is incorporated herein by reference.

Figure 5:
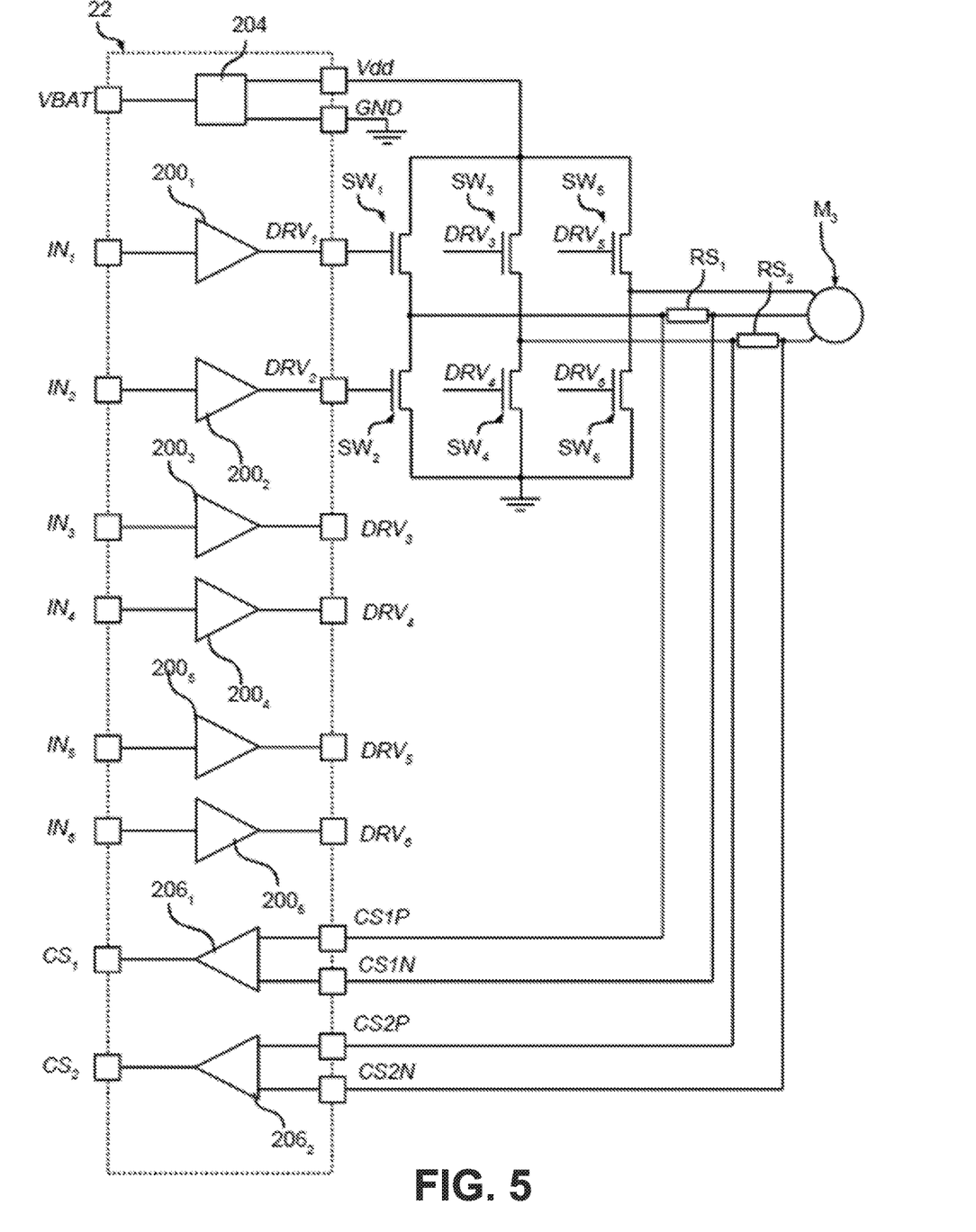
FIGS. 5 and 6 show an example of a half-bridge driver.

FIG. 5 schematically shows the structure of such an IC 22. Specifically, this IC 22 is able to receive at respective inputs six control signals $IN_1 \ldots IN_6$ and generate at respective outputs six drive signals $DRV_1 \ldots DRV_6$.

Figure 6:
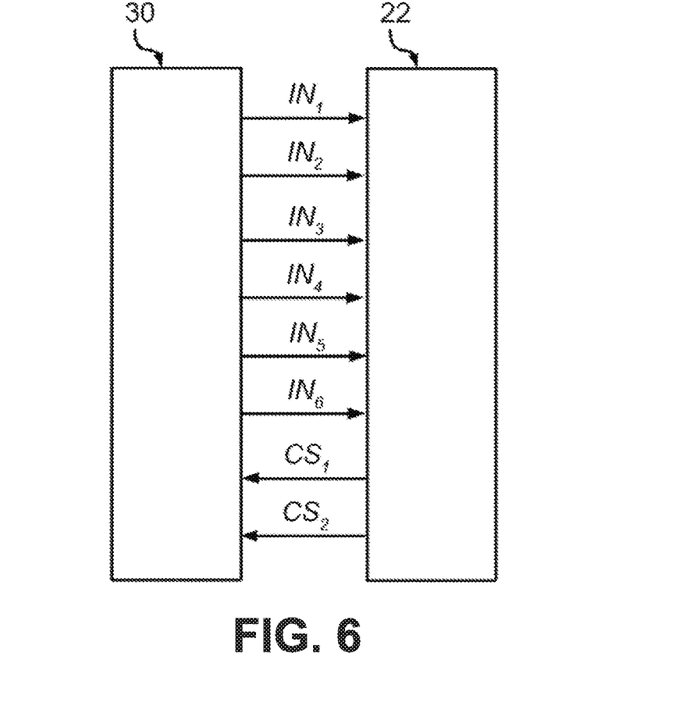

For example, as shown in FIG. 6, the IC 22 may be connected to a signal generator 30, such as a microcontroller, configured to generate the control signals $IN_1 \ldots IN_6$. Accordingly, the IC 22 comprises three high side drivers $200_1$, $200_3$ and $200_5$ configured to generate respective drive signals $DRV_1$, $DRV_3$ and $DRV_5$ for three high side switches $SW_1$, $SW_3$ and $SW_5$ and three low side drivers $200_2$, $200_4$ and $200_6$ configured to generate respective drive signals $DRV_2$, $DRV_4$ and $DRV_6$ for three low side switches $SW_2$, $SW_4$ and $SW_6$.

Often, such a SPD device 22 comprises also an electronic converter 204 configured to generate the supply voltage Vdd for the half-bridges as a function of a power supply, such as a battery voltage VBAT.

Moreover, often the IC 22 comprises differential amplifiers 206 arranged to measure the motor phase currents. Specifically, the L9907 IC comprises two differential amplifiers $206_1$ and $206_2$ arranged to generate two measurement signals $CS_1$ and $CS_2$ by measuring the current flowing through two motor phases, e.g., by using respective shunt resistors $RS_1$ and $RS_2$ connected in series with a respective motor phase. For example, as shown in FIG. 6, the measurements signals $CS_1$ and $CS_2$ may then be provided to the circuit 30, which may calculate the current of the third motor phase via Kirchhoff's law. Specifically, the circuit 30 may generate the six PWM signals $IN_1 \ldots IN_6$ for the inputs of the IC 22 and synchronously monitor the two measurement signals $CS_1$, $CS_2$ at the output of the IC 22.

Accordingly, in the solution shown in FIG. 6, the signal generator 30 generates for each half-bridge two separate control signals for the high side and the low side switches, e.g., signals $IN_1$ and $IN_2$, while the solution shown in FIG. 1 uses a single signal $IN_1$ and an inverter 202 in order to generate the complementary signal $IN_2$. Specifically, as shown in FIG. 4, in this way the signal generator 20 may generate a control signal $IN_2$ having a given switching period corresponding usually to the switching period $T_{PWM}$. However, the switch-on period $T_{ON2}$ of the signal $IN_2$ may not correspond directly to the switch-off period $T_{OFF1}$ of the signal $IN_1$ (as in FIG. 1), but the signal generator 30 may introduce delays, i.e.:

a delay $T_{ONDT}$ between the instant when the low side control signal $IN_2$ goes to low and the instant when the high side control signal $IN_1$ goes to high; and a delay $T_{OFFDT}$ between the instant when the high side control signal $IN_1$ goes to low and the instant when the low side control signal $IN_2$ goes to high.

Accordingly, usually the signal generator 30 is configured to generate a control signal $IN_2$ with:

$$T_{ON2} = T_{OFF1} - T_{ONDT} - T_{OFFDT} \quad (4)$$

$$T_{OFF2} = T_{ON1} + T_{ONDT} + T_{OFFDT} \quad (5)$$

For example, the delays $T_{ONDT}$ and $T_{OFFDT}$ may depend on the type of the electronic switches $SW_1$ and $SW_2$, etc.

Thus, the solution shown in FIG. 6 is more flexible, but additional control signals are required, rendering the solution more complex.

SUMMARY

In view of the above, various embodiments provide solutions for generating the drive signals for one or more half-bridges.

Various embodiments relate to a half-bridge driver circuit. Various embodiments concern a related integrated circuit and system.

In some embodiments, the half-bridge driver circuit comprises (at least) two output terminals for providing a high side drive signal for a high side switch and a low side drive signal for a low side switch. In various embodiments, the half-bridge driver circuit, such as an integrated circuit, comprises a high side driver circuit configured to generate the high side drive signal as a function of a high side control signal and a low side driver circuit configured to generate the low side drive signal as a function of a low side control signal. For example, such a half-bridge driver circuit may be used to drive a single phase or multi-phase motor via a signal generator.

In various embodiments, the high side control signal and the low side control signals are PWM signals having a given switching period, where the high side control signal has a given switch-on duration and the low side control signal has a first delay between the instant when the low side control signal goes to low and the instant when the high side control signal goes to high and a second delay between the instant when the high side control signal goes to low and the instant when the low side control signal goes to high. Accordingly, as described in the foregoing, in some embodiments the signal generator provides two PWM signals to the half-bridge driver circuit. Conversely, in various embodiments, the half-bridge driver circuit comprises an input terminal for receiving a control signal and a processing circuit configured to generate the high side control signal and the low side control signal as a function of the control signal. In various embodiments, the control signal is not a traditional PWM signal, but the control signal is a periodic signal with a given switching period and having two pulses for each switching period. More specifically, the four edges of the two pulses are aligned with the four sequential instants:

1) when the low side control signal should be switched-off, 2) after the first delay, when the high side control signal should be switched-on, 3) after the switch-on duration of the high side control signal, when the high side control signal should be switched-off, and 4) after the second delay, when the low side control signal should be switched-on.

In various embodiments, the processing circuit comprises an edge detector configured to generate a first signal in response to a first type of edge (e.g., a rising edge) in the control signal and a second signal in response to a second type of edge (e.g., a falling edge) in the control signal, where the second type of edge is opposed to the first type of edge.

In various embodiments, the first signal and the second signal are processed by a state machine in order to generate the high side and low side control signals. In various embodiments, the state machine is configured to:

in response to the first signal, set the high side control signal and the low side control signal to a first logic level (e.g., low);

in response to the second signal, set the high side control signal to a second logic level (e.g., high) and the low side control signal to the first logic level;

in response to the first signal, set the high side control signal and the low side control signal to the first logic level; and in response to the second signal, set the high side control signal to the first logic level and the low side control signal to the second logic level.

Accordingly, by using a control signal comprising a first and a second pulse for each switching cycle, the processing circuit generates the high side control signal and the low side control signal as PWM signals, where the low side control signal corresponds to an inverted version of the high side control signal with the first delay between the falling edge of the low side control signal and a following rising edge of the high side control signal and with the second delay between the falling edge of the high side control signal and the following rising edge of the low side control signal. For example, when the first type of edge is a rising edge and the second type of edge is a falling edge, the duration of the first delay corresponds to the duration of the first pulse of the control signal and the duration of the second delay corresponds to the duration of the second pulse of the control signal.

In various embodiments, the state machine may comprise four states for implementing the above four transitions, i.e., one state for each transition. Alternatively, the state machine may also comprise only three states for implementing the above four transitions, where a given state is used for both the first and the second delay. In this case, the state machine may receive a synchronization signal, which is used to decide whether the state machine should proceed from the given state to either the state for switching the high side control signal to high or the state for switching the low side control signal to high.

In various embodiments, the state machine is configured to proceed to one of the states in response to a reset signal.

Generally, the synchronization signal and/or the reset signal may be provided to the half-bride driver circuit via the signal generator, which thus may synchronize (possibly for each switching cycle) the state machine with the control signal.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 7 to 13, parts, elements or components which have already been described with reference to FIGS. 1 to 6 are denoted by the same references previously used in such Figures; the description of such previously described elements will not be repeated in the following in order not to overburden the present detailed description.

As mentioned in the foregoing, the present disclosure relates to a half-bridge driver circuit, such as a half-bridge driver IC.

As described in the foregoing, in the architecture shown in FIGS. 5 and 6, the signal generation circuit 30, such as a microcontroller, is configured to generate six PWM signals $IN_1 \ldots IN_6$, which are provided at respective inputs to a driver IC 22. For example, when driving a three-phase motor $M_3$ as shown in FIG. 3, the various outputs $OUT_a$, $OUT_b$ and $OUT_c$ are sequentially connected to the supply voltage Vdd (and Ground GND), as described e.g., in document "AN1088—APPLICATION NOTE—L6234 THREE PHASE MOTOR DRIVER", STMicroelectronics, April 2001, which is incorporated herein by reference.

However, this solution is complex because two control signals have to be provided to the driver circuit 22 for each half-bridge. For example, this may result in additional complexity when the signal generator 30 and/or the driver circuit 22 should also monitor the PWM control signals for detecting errors. For example, a possible solution for monitoring PWM signals is described in Italian patent application IT102016000049920, which is incorporated herein by reference. Specifically, in this document, circuits able to monitor the period, switch-on and switch-off duration of a PWM signal are described.

Accordingly, when using such a solution in the signal generator 30 and/or driver circuit 22, six error detection circuits would be required.

Various embodiments of the present disclosure relate to a driver circuit 22a that may operate with a reduced number of control signals such that the signal generator 30 (e.g., a microcontroller) generates less control signals.

Figure 7:
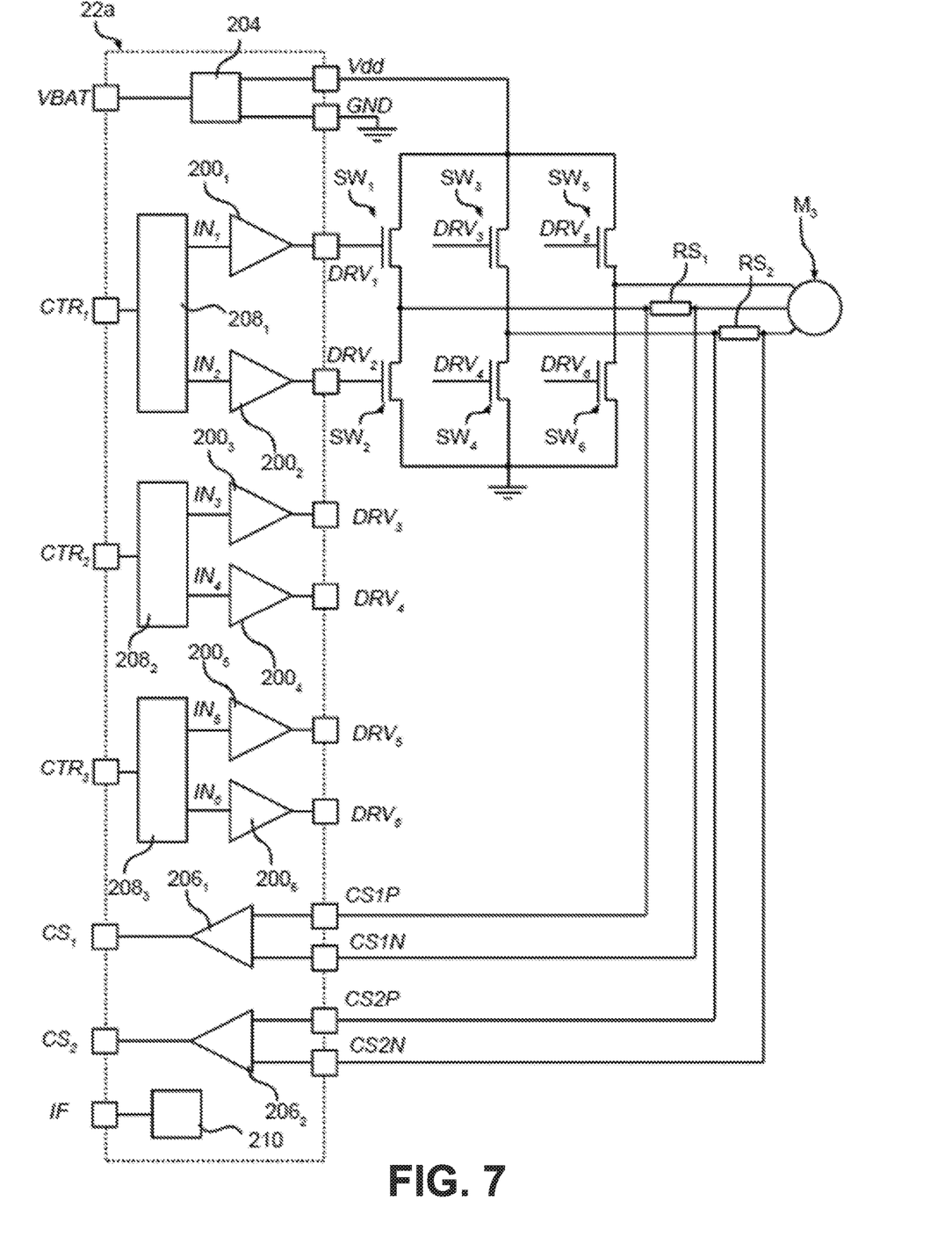
FIG. 7 shows an embodiment of a half-bridge driver circuit comprising a processing circuit configured to generate high side and low side control signals as a function of a control signal.

For example, FIG. 7 shows an embodiment of a driver circuit 22a, such as an integrated circuit, configured to receive at an input a single control signal CTR for each half-bridge, and the driver circuit 22a is configured to generate a high side drive signal for a respective high side switch and a low side drive signal for a respective low side switch as a function of the control signal CTR. Specifically, in the embodiment considered, the driver circuit 22a comprises a respective high side drive circuit for generating the high side drive signal as a function of a high side control signal and a low side drive circuit for generating the low side drive signal as a function of a low side control signal. Accordingly, in various embodiment, the driver circuit 22a comprises a processing circuit 208 configured to generate the high side control signal and the low side drive signal for the high side and low side drivers as a function of the respective control signal CTR.

For example, in the embodiment considered, the driver circuit 22a is again configured to drive three half bridges. Accordingly, the driver circuit is configured to receive three control signals $CTR_1$, $CTR_2$ and $CTR_3$ and generate respective drive signals $DRV_1$, $DRV_3$ and $DRV_5$ for three high side switches $SW_1$, $SW_3$ and $SW_5$ and respective drive signals $DRV_2$, $DRV_4$ and $DRV_6$ for three low side switches $SW_2$, $SW_4$ and $SW_6$.

More specifically, the driver circuit 22a comprises three circuits $208_1$, $208_2$ and $208_3$ configured to generate for each control signals $CTR_1$, $CTR_2$ and $CTR_3$ a respective high side control signal $IN_1$, $IN_3$ and $IN_5$ and a respective low side control signal $IN_2$, $IN_4$ and $IN_6$.

Generally, the implementation of the driver circuit 22a for generating a drive signal DRV as a function of the control signal IN may correspond to the architecture of the circuit 22 shown in FIG. 5 and the respective description fully applies. For example, in the embodiment considered, the driver circuit 22a comprises three high side drivers $200_1$, $200_3$ and $200_5$ configured to generate the drive signals $DRV_1$, $DRV_3$ and $DRV_5$ for three high side switches $SW_1$, $SW_3$ and $SW_5$ and three low side drivers $200_2$, $200_4$ and $200_6$ configured to generate the drive signals $DRV_2$, $DRV_4$ and $DRV_6$ for three low side switches $SW_2$, $SW_4$ and $SW_6$. Optionally, the driver circuit 22a may also comprise the electronic converter 204 configured to generate the supply voltage Vdd and/or the differential amplifiers 206 for measuring the current flowing through the motor phases.

Accordingly, in the embodiment considered, the driver circuit 22a is arranged to drive $N=3$ half-bridges, where the driver circuit 22a comprises for each half-bridge a respective high side driver and a respective low side driver. Generally, the driver circuit 22a could also be configured to drive less (e.g., one or two) or more half-bridges.

Moreover, even though being arranged to drive $N=3$ half-bridges, the driver circuit 22a may also be used to drive a motor $M_1$ connected between the output of a half-bridge and ground GND (see FIG. 1). For example, for this purpose, only two drive signals (e.g., $DRV_1$ and $DRV_2$) of the driver circuit 22a may be used. Similarly, the driver circuit 22a may also be used to drive a motor $M_2$ connected between the outputs of two half-bridge (see FIG. 2). For example, for this purpose, only four drive signals (e.g., $DRV_1 \ldots DRV_4$) of the driver circuit 22a may be used. Thus, generally the driver circuit 22a may be configured to drive a single-phase motor via one or two half-bridges, or a multi-phase motor (e.g., a three-phase motor) via a corresponding number of half-bridges.

As described in the foregoing, in various embodiments, the driver circuit 22a comprises for each half-bridge a single input for receiving a respective control signal (CTR and a circuit 208 configured to generate a respective high side control signal (e.g., signal $IN_1$) and a respective low side control signal (e.g., signal $IN_2$), which are provided to a high side driver (e.g., $200_1$) and a low side driver (e.g., $200_2$), respectively.

Figure 8:
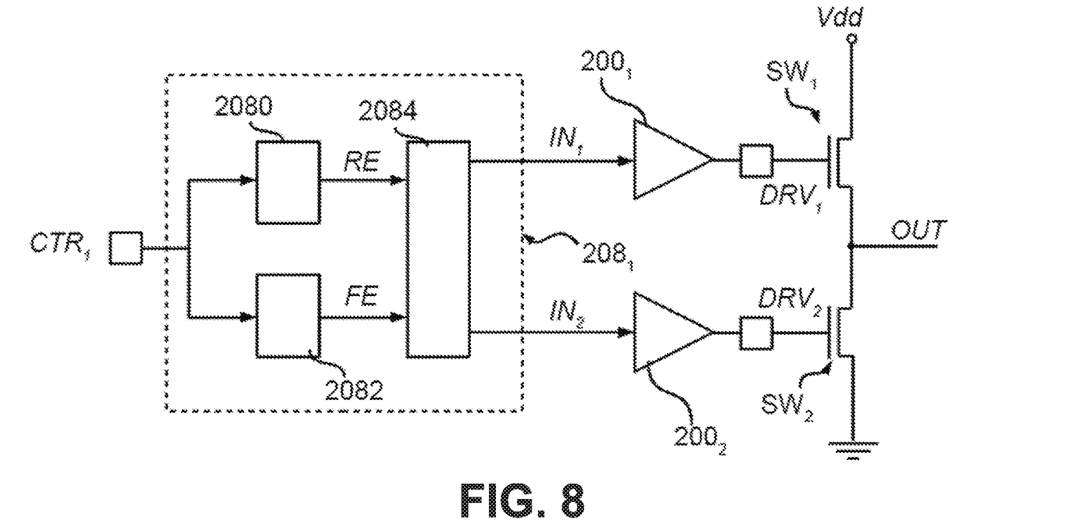
FIGS. 8, 9, 10 and 11 show an embodiment of the processing circuit of FIG. 7.

FIG. 8 shows a first embodiment of the circuit 208, such as the circuit $208_1$ configured to generate the signals $IN_1$ and $IN_2$ as a function of the control signal $CTR_1$. Generally, the same architecture may be used also for the other circuits 208.

Specifically, in the embodiment considered, the circuit $208_1$ comprises a rising edge detector 2080 configured to generate a signal RE by analyzing the control signal $CTR_1$, i.e., the signal RE indicates a rising edge in the signal $CTR_1$. Moreover, the circuit $208_1$ comprises a falling edge detector $208_2$ configured to generate a signal FE by analyzing the control signal $CTR_1$, i.e., the signal FE indicates a falling edge in the signal $CTR_1$. Generally, the edge detectors 2080 and 2082 may also be combined in a single edge detector providing both signals RE and FE. In the embodiment considered, the signal RE and FE are provided to a (finite) state machine 2084 configured to generate the high side control signal $IN_1$ and the low side control signal $IN_2$.

Figure 9:
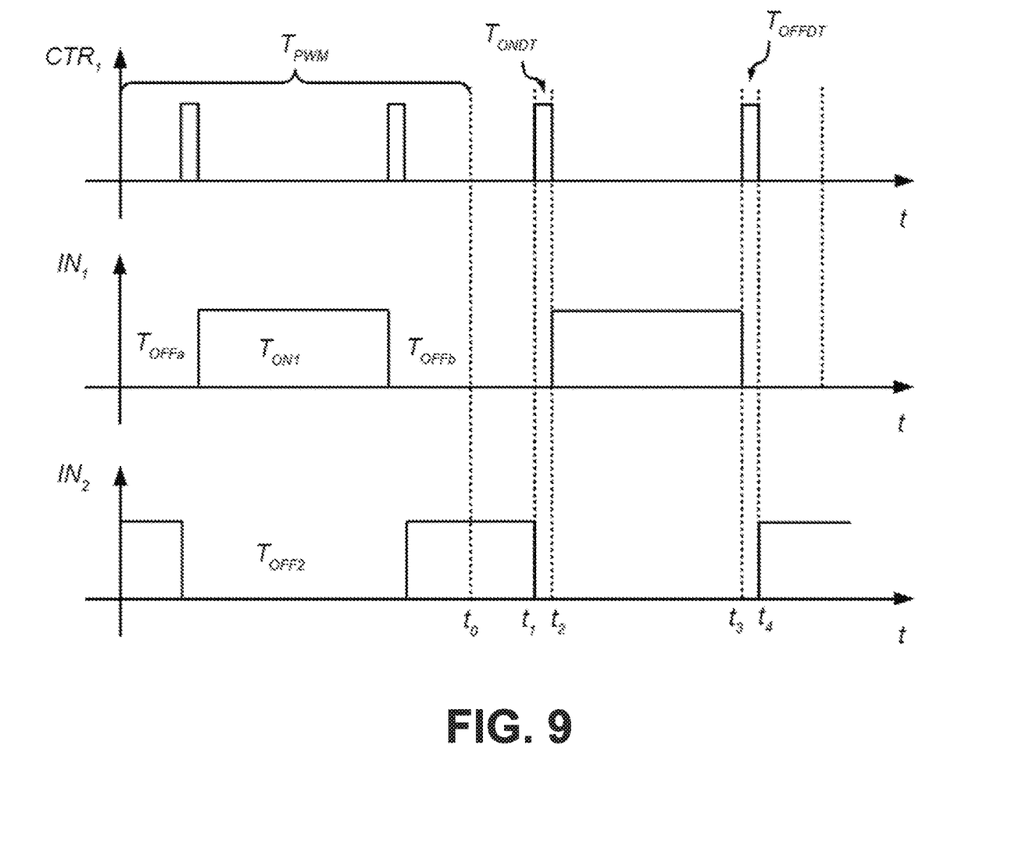

FIG. 9 shows an embodiment of the operation of the processing circuit 208.

Specifically, in the embodiment considered, the control signal $CTR_1$ is not a traditional PWM signal, but the signal generator 30 is configured to generate a control signal $CTR_1$ comprising pulses in correspondence to the delays $T_{ONDT}$ and $T_{OFFDT}$, i.e., the signal $CTR_1$ is a periodic signal with a given duration $T_{PWM}$ comprising:
 a first pulse with duration $T_{ONDT}$, where the first pulse starts after the switch-off duration ($T_{OFFa}-T_{ONDT}$) from the beginning of the corresponding PWM cycle; and
 a second pulse with duration $T_{OFFDT}$, where the second pulse starts after the switch-on duration $T_{ON}$ from the end of the first pulse.

Accordingly, assuming that the PWM cycle starts at an instant $t_0$, the signal $CTR_1$ comprises:
 a rising edge at an instant $t_1=T_{OFFa}-T_{ONDT}$;
 a falling edge at an instant $t_2=t_1+T_{ONDT}=T_{OFFa}$;
 a rising edge at an instant $t_3=t_2+T_{ON}$; and
 a falling edge at an instant $t_4=t_3+T_{OFFDT}$.

Generally, the signal $CTR_1$ and thus the above edges may also be inverted. Accordingly, generally, the edge detector 2080 is configured to generate a signal RE indicative of a first type of edge (e.g., rising in the embodiment considered) and the edge detector 2082 is configured to generate a signal FE indicative of a second type of edge opposed to the first type of edge (e.g., falling in the embodiment considered).

Generally, the edge detectors 2080 and 2082 may be implemented with asynchronous or synchronous edge detectors. For example, a synchronous edge detector may sample the signal $CTR_1$ in order to determine a bit sequence. Accordingly, a rising edge may be detected when the bit sequence has the value "01" for a two-bit sequence, or "001" or "011" for a three-bit sequence, etc. Similarly, a falling edge may be detected when the bit sequence has the value "10" for a two-bit sequence, or "100" or "110" for a three-bit sequence, etc.

Figure 10:
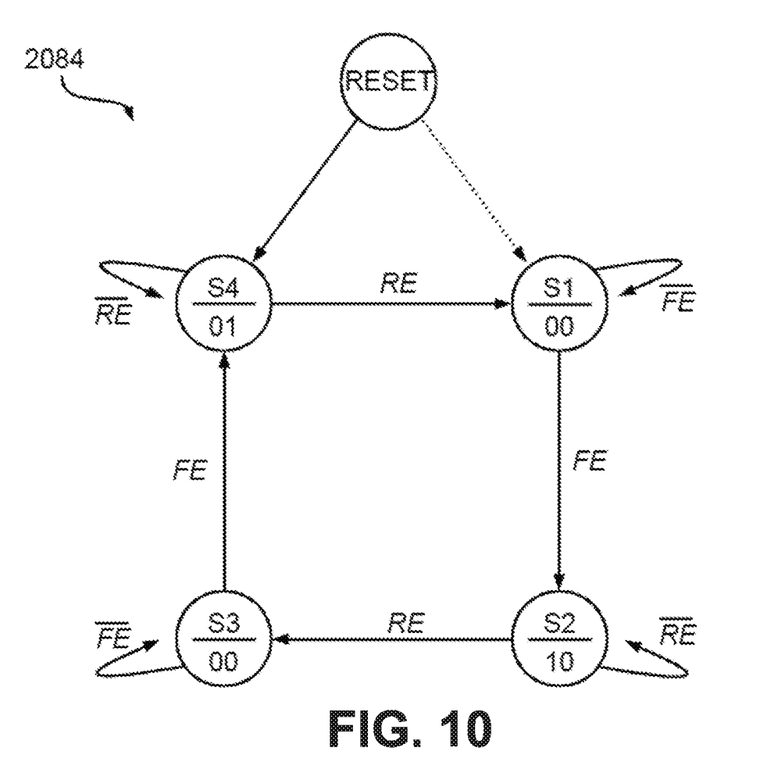

FIG. 10 shows an embodiment of the state machine 2084, which, e.g., may be implemented with a sequential logic circuit.

Specifically, in the embodiment considered, the state machine comprises at least four states S1 . . . S4, in particular:
 state S1 is used to generate the control signals $IN_1/IN_2$ during the duration $T_{ONDT}$, i.e., $IN_1$="0" and $IN_2$="0";
 state S2 is used to generate the control signals $IN_1/IN_2$ during the duration $T_{ON}$, i.e., $IN_1$="1" and $IN_2$="0";
 state S3 is used to generate the control signals $IN_1/IN_2$ during the duration $T_{OFFDT}$, i.e., $IN_1$="0" and $IN_2$="0";
 state S4 is used to generate the control signals $IN_1/IN_2$ during the remaining duration $T_{OFF}$ (in particular the duration $T_{OFF}-T_{OFFDT}-T_{ONDT}$), i.e., $IN_1$="0" and $IN_2$="1".

In various embodiments, after a reset of the circuit 208, the state machine 2084 may move to one of the states S1 . . . S4. For example, based on the application, the state machine may move to the states S1 or S3, where the half-bridge switches are switched off, or preferably the state S4, where only the low side switch is closed. In various embodiments, the circuit 208 may be configured to render the initial state after a reset programmable. For example, in various embodiments, the driver circuit 22a may comprise a communication interface 210 connected to one or more interface terminals IF (see FIG. 7). For example, the communication interface 210 may be serial communication interface, such as Inter-Integrated Circuit (I2C), Serial Peripheral Interface bus (SPI), or Universal asynchronous receiver-transmitter (UART).

The operation of the state machine 2084 will now be described at a typical switching cycle, assuming the state machine is in the state S4 at the beginning of a new switching cycle, i.e., instant $t_0$. Specifically, in the state S4, the high side switch $SW_1$ is opened ($IN_1$="0") and the low side switch $SW_2$ is closed ($IN_2$="1").

The state machine is configured to remain in the state S4 until a new (rising) edge is signaled by the circuit 2080 via the signal RE (instant $t_1$). Accordingly, once the signal RE is set, the state machine proceeds to the state S1, in which the high side switch $SW_1$ and the low side switch $SW_2$ are opened ($IN_1$="0" and $IN_2$="0").

The state machine is configured to remain in the state S1 until a new (falling) edge is signaled by the circuit 2082 via the signal FE (instant $t_2$). Accordingly, once the signal FE is set, the state machine proceeds to the state S2, in which the high side switch $SW_1$ is closed ($IN_1$="1") and the low side switch $SW_2$ is opened ($IN_2$="0").

The state machine is configured to remain in the state S2 until a new (rising) edge is signaled by the circuit 2080 via the signal RE (instant $t_3$). Accordingly, once the signal RE is set, the state machine proceeds to the state S3, in which the high side switch $SW_1$ and the low side switch $SW_2$ are opened ($IN_1$="0" and $IN_2$="0").

Finally, the state machine is configured to remain in the state S3 until a new (falling) edge is signaled by the circuit 2082 via the signal FE (instant $t_4$). Accordingly, once the signal FE is set, the state machine proceeds again to the state S4, in which the high side switch $SW_1$ is opened ($IN_1$="0") and the low side switch $SW_2$ is closed ($IN_2$="1").

Accordingly, in response to the rising and falling edges in the control signal CM, the state machine evolves sequentially through the states S1 . . . S4.

Figure 11:
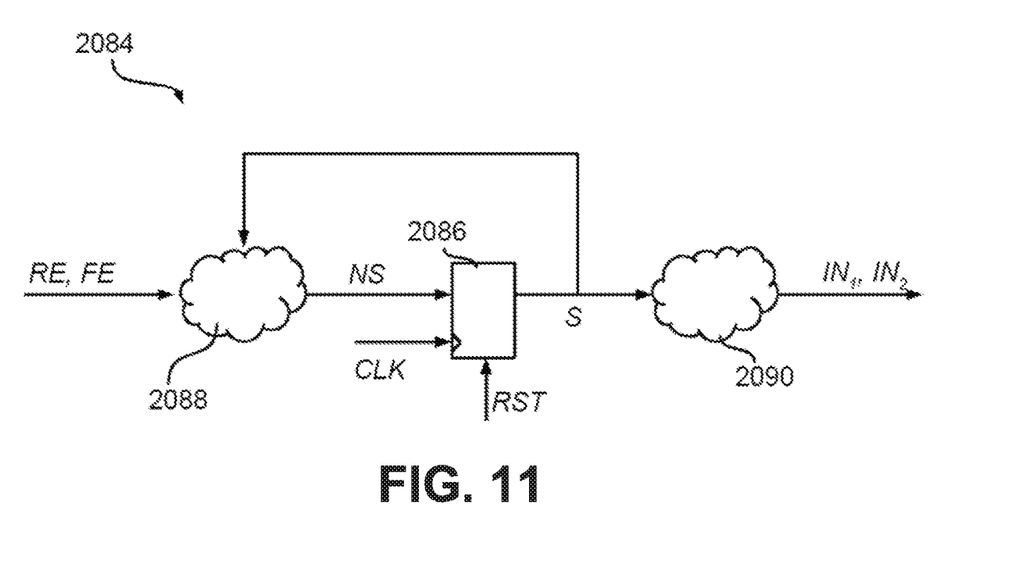

For example, FIG. 11 shows a possible implementation of the state machine 2084.

In the embodiment considered, the state machine is implemented with a Moore state machine comprising:

a state register 2086 configured to store the value of a current state S, where the value of a next states NS is stored in response to a clock signal CLK;

a combinational logic 2088 circuit configured to generating the next state signal NS as a function of the current state S (at the output of the states register 2086) and the input signals, i.e., signals RE and FE; and a combinational logic circuit 2090 configured to generating the output signals $IN_1$ and $IN_2$ as a function of the current state S (at the output of the states register 2086).

Moreover, as mentioned before, the state register 2086 may support a reset, e.g., via a reset signal RST, which sets the content of the register 2086 to a reset value, e.g., corresponding to the bit sequence associated with the state S4.

For example, in various embodiments, the register 2086 has three bits and the following encoding is used for the states:

S1: S="000";
S2: S="110";
S3: S="100"; and
S4: S="001".

For example, by using this encoding, the circuit 2090 may select the second bit of state S as the control signal $IN_1$ and the third/last bit of state S as the control signal $IN_2$.

Generally, the state machine 2084 may also be configured to monitor incongruent input signals. For example, the state machine may monitor in the states S1 and S3 whether the signal RE is set and possibly proceed to an error state. Similarly, the state machine may monitor in the states S3 and S4 whether the signal FE is set and possibly proceed to an error state.

Similarly, the state machine 2084 may monitor the state signal S in order to determine incongruent states. For example, in the embodiment considered, the states "011" and "111" may be incongruent states, because the last two bits should not be set contemporaneously to "1". Also in this case, the state machine may proceed to an error state.

Accordingly, in the embodiment considered, the state machine 2084 performs transitions in response to the signals RE and FE (i.e., in response to the rising and falling edges in the signal the signal $CTR_1$), thereby sequentially passing through the states S1 . . . S4 starting from a given reset state.

However, when loosing synchronization, e.g., due to errors/glitches in the control signal CTR the state machine may skip one of the two pulses in the control signal $CTR_1$ resulting in an inversion of the control signals $IN_1$ and $IN_2$, i.e., an incorrect driving of the half-bridge. To detect this type of fault, different counter measures can be implemented. For example, in various embodiments, the circuit 208 may comprise an internal watchdog timer. For example, the internal watchdog timer may be reset by the signal RE (or by the signal FE) and it communicates an error if the timer reaches a programmable threshold. For example, in various embodiments, the threshold is set via the interface 210. Generally, the threshold should be greater than MAX ($T_{PWM}-T_{ONDT}$, $T_{PWM}-T_{OFFDT}$) and smaller than $T_{PWM}$.

Figure 12:
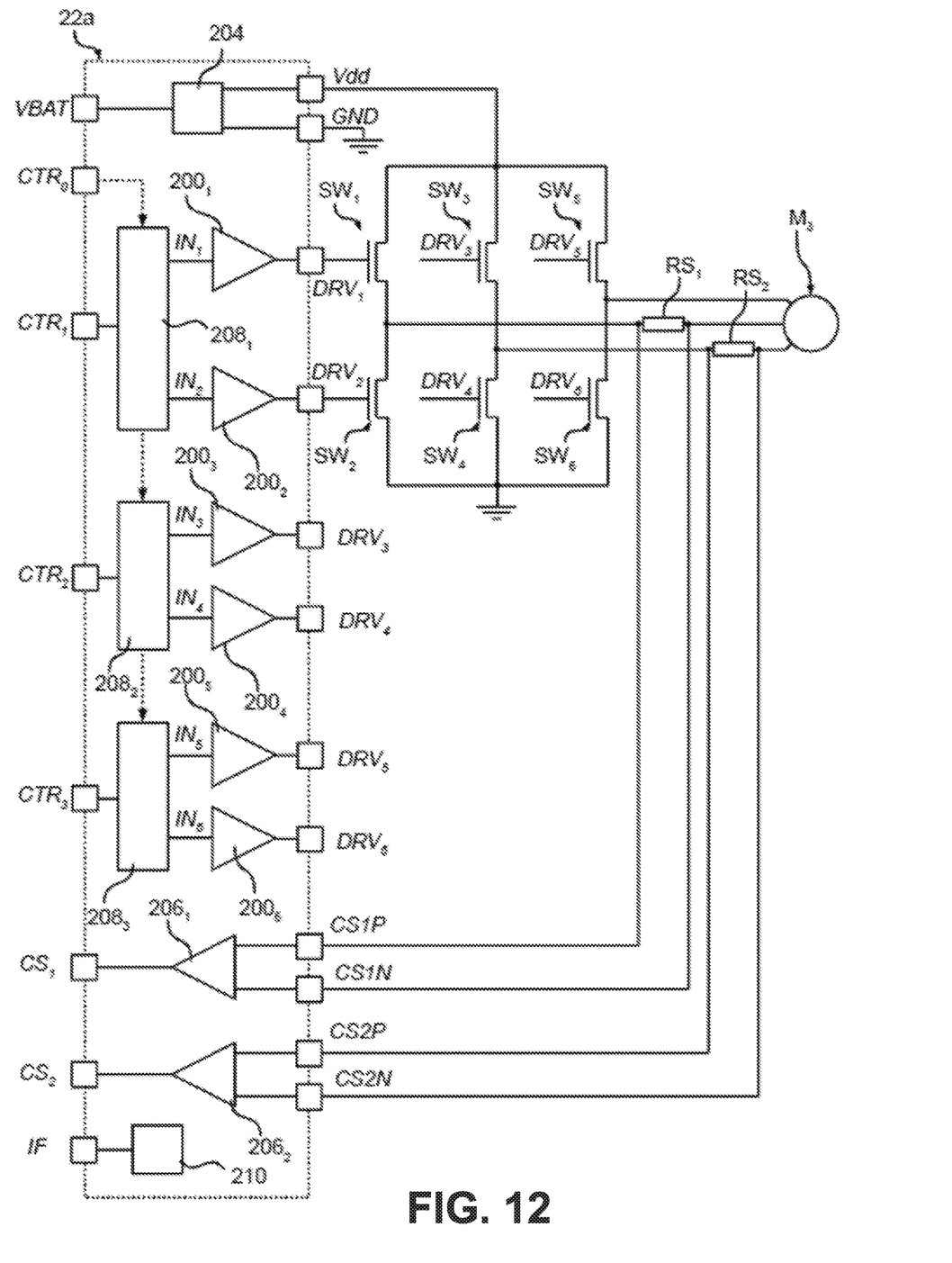
FIG. 12 shows a further embodiment of a half-bridge driver circuit comprising a processing circuit configured to generate high side and low side control signals as a function of a control signal.

FIG. 12 shows a further embodiment of the driver circuit 22a comprising an additional terminal for receiving a further control/synchronization signal $CTR_0$.

Specifically, the control signal $CTR_0$ is arranged to identify the respective switching cycle.

For example, the control signal $CTR_0$ may be a left-aligned PWM signal having again the switching period $T_{PWM}$. For example, the control signal $CTR_0$ may comprise a short pulse (with a duration being smaller than $T_{OFFa}$) and the state machine 2084 may be configured to move to the state S4 in response to the control signal $CTR_0$, e.g., by using the signal $CTR_0$ as reset signal RST for the state register 2086.

Alternatively, the control signal $CTR_0$ may be a left-aligned PWM signal having a switch-on duration being greater than $T_{OFFa}$ and smaller than $T_{OFFa}+T_{ON}$, such as a PWM signal with 50% duty cycle. Accordingly, by providing the control signal $CTR_0$ to the control circuits 208, in particular the state machines 2084, each state machine may determine whether a given (rising or falling) edge belongs to the interval $T_{ONDT}$ or $T_{OFFDT}$. For example, in this case, the state machine may directly use the logic level of the control signal $CTR_0$ in order to determine e.g.:

whether the state machine 2084 should proceed either to the state S1 (e.g., $CTR_0$="1") or S3 (e.g., $CTR_0$="0") in response to a rising edge (RE="1"); and whether the state machine 2084 should proceed either to the state S2 (e.g., $CTR_0$="1") or S4 (e.g., $CTR_0$="0") in response to a falling edge (FE="1").

Figure 13:
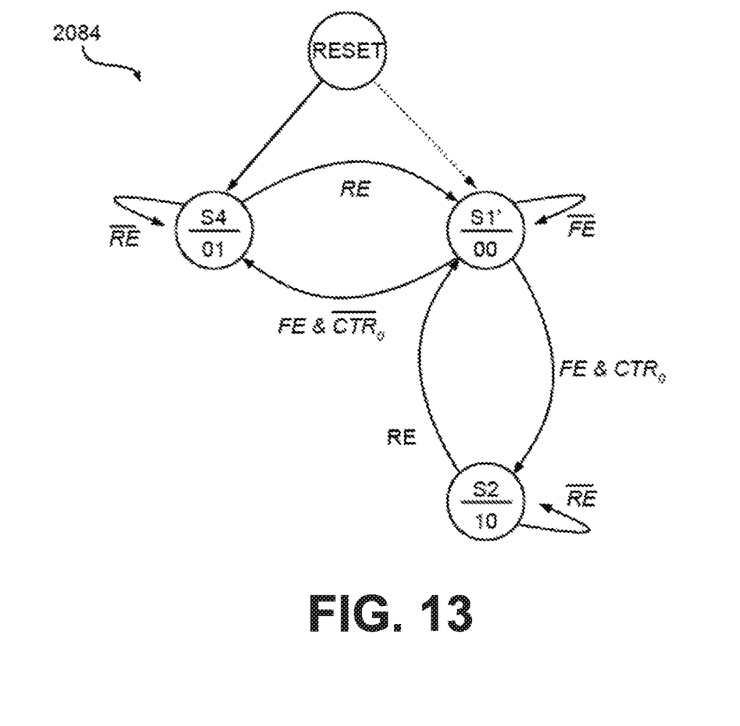
FIG. 13 show an embodiment of the processing circuit of FIG. 12.

For example, a modified state machine is shown in FIG. 13.

Specifically, in the embodiment considered, the states S1 and S3 have been combined in a single state S1'.

For example, again assuming that the state machine 2084 is in the state S4 at the beginning of a new switching cycle, i.e., instant $t_0$, the high side switch $SW_1$ is opened ($IN_1$="0") and the low side switch $SW_1$ is closed ($IN_2$="1").

The state machine is configured to remain in the state S4 until a new (rising) edge is signaled by the circuit 2080 via the signal RE. Accordingly, once the signal RE is set, the state machine proceeds to the state S1, in which the high side switch $SW_1$ and the low side switch $SW_2$ are opened ($IN_1$="0" and $IN_2$="0").

The state machine is configured to remain in the state S1 until a new (falling) edge is signaled by the circuit 2082 via the signal FE. Accordingly, once the signal FE is set, the state machine proceeds either:

to the state S2 when the signal $CTR_0$ is set; or
to the state S4 when the signal $CTR_0$ is not set.

Specifically, in the state S2 the high side switch $SW_1$ is again closed ($IN_1$="1") and the low side switch $SW_2$ is opened ($IN_2$="0").

Generally, the control/synchronization signal $CTR_0$ may have inverted logic levels. Moreover, a single control/synchronization signal $CTR_0$ may be used for all circuits 208. For example, in this case, a driver circuit 22a for three half-bridges may receive at respective inputs four control signals instead of the six control signals shown in FIG. 5 in the context of prior-art solutions.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A half-bridge driver circuit comprising:
    a high side output terminal configured to provide a high side drive signal for a high side switch;
    a low side output terminal configured to provide a low side drive signal for a low side switch;
    a high side driver circuit configured to generate the high side drive signal as a function of a high side control signal;
    a low side driver circuit configured to generate the low side drive signal as a function of a low side control signal;
    an input terminal configured to receive a control signal;
    an edge detector configured to generate a first signal in response to a first type of edge in the control signal, and a second signal in response to a second type of edge in the control signal, the second type of edge being opposed to the first type of edge; and
    a state machine comprising a plurality of states, wherein transition between the states occurs in response to the first signal and the second signal, and wherein the state machine is configured to sequentially:
        in response to the first signal, set the high side control signal and the low side control signal to a first logic level,
        in response to the second signal, set the high side control signal to a second logic level and the low side control signal to the first logic level,
        in response to the first signal, set the high side control signal and the low side control signal to the first logic level, and
        in response to the second signal, set the high side control signal to the first logic level and the low side control signal to the second logic level.

2. The half-bridge driver circuit of claim 1, wherein the control signal is a periodic signal comprising first and second pulses for each switching cycle, wherein the high side control signal and the low side control signal are generated as PWM signals, wherein the low side control signal corresponds to an inverted version of the high side control signal with a first delay between a falling edge of the low side control signal and a following rising edge of the high side control signal and with a second delay between a falling edge of the high side control signal and a following rising edge of the low side control signal.

3. The half-bridge driver circuit of claim 2, wherein the first type of edge is a rising edge and the second type of edge is a falling edge, wherein a duration of the first delay corresponds to a duration of the first pulse of the control signal and a duration of the second delay corresponds to a duration of the second pulse of the control signal.

4. The half-bridge driver circuit of claim 1, wherein the first logic level is low and the second logic level is high.

5. The half-bridge driver circuit of claim 1, wherein the state machine comprises:
    a first state in which the high side control signal and the low side control signal are set to the first logic level;
    a second state in which the high side control signal is set to the second logic level and the low side control signal is set to the first logic level;
    a third state in which the high side control signal and the low side control signal are set to the first logic level; and
    a fourth state in which the high side control signal is set to the first logic level and the low side control signal is set to the second logic level.

6. The half-bridge driver circuit of claim 5, wherein the state machine is configured to:
    proceed from the first state to the second state in response to the second signal;
    proceed from the second state to the third state in response to the first signal;
    proceed from the third state to the fourth state in response to the second signal; and
    proceed from the fourth state to the first state in response to the first signal.

7. The half-bridge driver circuit of claim 5, wherein the state machine is configured to proceed to one of the first, second, third, or fourth states in response to a reset signal.

8. The half-bridge driver circuit of claim 7, wherein the state machine is configured to proceed to the fourth state in response to a reset signal.

9. The half-bridge driver circuit of claim 7, further comprising a further input terminal configured to receive the reset signal.

10. The half-bridge driver circuit of claim 1, wherein the state machine comprises:
    a first state in which the high side control signal and the low side control signal are set to the first logic level;
    a second state in which the high side control signal is set to the second logic level and the low side control signal is set to the first logic level; and
    a third state in which the high side control signal is set to the first logic level and the low side control signal is set to the second logic level.

11. The half-bridge driver circuit of claim 10, wherein the state machine is configured to:
    receive a synchronization signal;
    when the synchronization signal has a first logic level, proceed from the first state to the second state in response to the second signal;
    when the synchronization signal has a second logic level, proceed from the first state to the third state in response to the second signal;
    proceed from the second state to the first state in response to the first signal; and
    proceed from the third state to the first state in response to the first signal.

12. The half-bridge driver circuit of claim ii, further comprising a further input terminal configured to receive the synchronization signal.

13. The half-bridge driver circuit of claim 10, wherein the state machine is configured to proceed to one of the first, second or third states in response to a reset signal.

14. The half-bridge driver circuit of claim 1, further comprising:
    two further input terminals configured to receive two further control signals;

four further output terminals configured to provide two further high side drive signals for two further high side switches and two further low side drive signals for two further low side switches;

two further high side driver circuits configured to generate the two further high side drive signals as a function of two further high side control signal;

two further low side driver circuits configured to generate the two further low side drive signals as a function of two further low side control signal; and two further circuits configured to generate the two further high side control signal and the two further low side control signal as a function of the two further control signals.

15. The half-bridge driver circuit of claim 14, further comprising the high side switch, the low side switch, the two further high side switches, and the two further low side switches coupled to the half-bridge driver circuit.

16. The half-bridge driver circuit of claim 1, wherein the half-bridge driver circuit is integrated in a monolithic integrated circuit.

17. A system comprising:
a half-bridge comprising a high side switch, a low side switch, and an output, wherein the output of the half-bridge is configured to be coupled to a phase of a motor;
a high side output terminal configured to provide a high side drive signal to the high side switch;
a low side output terminal configured to provide a low side drive signal to the low side switch;
a high side driver circuit configured to generate the high side drive signal as a function of a high side control signal;
a low side driver circuit configured to generate the low side drive signal as a function of a low side control signal;
a signal generator configured to generate a control signal;
an edge detector configured to generate a first signal in response to a first type of edge in the control signal, and a second signal in response to a second type of edge in the control signal, the second type of edge being opposed to the first type of edge; and
a state machine comprising a plurality of states, wherein transition between the states occurs in response to the first signal and the second signal, and wherein the state machine is configured to sequentially:
in response to the first signal, set the high side control signal and the low side control signal to a first logic level,
in response to the second signal, set the high side control signal to a second logic level and the low side control signal to the first logic level;
in response to the first signal, set the high side control signal and the low side control signal to the first logic level, and
in response to the second signal, set the high side control signal to the first logic level and the low side control signal to the second logic level.

18. The system of claim 17, further comprising the motor, wherein the output of the half-bridge is coupled to a phase of the motor.

19. The system of claim 18, wherein the motor is a multi-phase motor.

20. A method comprising:
providing a high side drive signal to a high side switch of a half-bridge;
providing a low side drive signal to a low side switch of the half-bridge;
generating the high side drive signal as a function of a high side control signal;
generating the low side drive signal as a function of a low side control signal;
receiving a control signal;
generating the high side control signal and the low side control signal as a function of the control signal;
generating a first signal in response to a first type of edge in the control signal;
generating a second signal in response to a second type of edge in the control signal, the second type of edge being opposed to the first type of edge; and
sequentially,
in response to the first signal, setting the high side control signal and the low side control signal to a first logic level,
in response to the second signal, setting the high side control signal to a second logic level and the low side control signal to the first logic level,
in response to the first signal, setting the high side control signal and the low side control signal to the first logic level, and
in response to the second signal, setting the high side control signal to the first logic level and the low side control signal to the second logic level.

21. The method of claim 20, further comprising driving a three-phase motor with the half-bridge.

22. The method of claim 20, further comprising:
receiving two further control signals;
providing two further high side drive signals to two further high side switches;
providing two further low side drive signals to two further low side switches;
generating the two further high side drive signals as a function of two further high side control signal;
generating the two further low side drive signals as a function of two further low side control signal; and
generating the two further high side control signal and the two further low side control signal as a function of the two further control signals.

* * * * *